(12) United States Patent
Ko et al.

(10) Patent No.: US 11,342,010 B2
(45) Date of Patent: May 24, 2022

(54) MANAGING BIT LINE VOLTAGE GENERATING CIRCUITS IN MEMORY DEVICES

(71) Applicant: Macronix International Co., Ltd., Hsinchu (TW)

(72) Inventors: Szu-yu Ko, Kaohsiung (TW); Shang-Chi Yang, Changhua County (TW)

(73) Assignee: Macronix International Co., Ltd., Hsinchu (TW)

(*) Notice: Subject to any disclaimer, the term of this patent is extended or adjusted under 35 U.S.C. 154(b) by 268 days.

(21) Appl. No.: 16/842,225

(22) Filed: Apr. 7, 2020

(65) Prior Publication Data
US 2021/0098037 A1   Apr. 1, 2021

Related U.S. Application Data

(60) Provisional application No. 62/908,605, filed on Oct. 1, 2019.

(51) Int. Cl.
| | |
|---|---|
| G11C 5/14 | (2006.01) |
| G11C 7/12 | (2006.01) |
| G05F 3/24 | (2006.01) |
| G11C 7/06 | (2006.01) |
| H03F 3/45 | (2006.01) |
| G11C 16/24 | (2006.01) |

(52) U.S. Cl.
CPC .............. *G11C 7/12* (2013.01); *G05F 3/247* (2013.01); *G11C 7/06* (2013.01); *H03F 3/45269* (2013.01); *G11C 16/24* (2013.01)

(58) Field of Classification Search
CPC .. G11C 7/12; G11C 7/06; G11C 16/24; G11C 7/062; G11C 5/147; G11C 16/30;
(Continued)

(56) References Cited

U.S. PATENT DOCUMENTS 6,005,438 A    12/1999 Shing
6,469,929 B1 * 10/2002 Kushnarenko ......... G11C 16/26
                                         365/210.1
(Continued)

FOREIGN PATENT DOCUMENTS

CN    101364119 A    2/2009
TW     I645415 B    12/2008
(Continued)

OTHER PUBLICATIONS

Taiwan Office Communication dated Mar. 31, 2021 for related TW Appl. No. 11020292260 (Non-English).

*Primary Examiner* — Tha-O H Bui
(74) *Attorney, Agent, or Firm* — Fish & Richardson P.C.

(57) ABSTRACT

Systems, methods, circuits, and apparatus including computer-readable mediums for managing bit line voltage generating circuits in memory devices are provided. An example bit line voltage generating circuit is configured to provide a stable clamping voltage to at least one bit line connecting memory cells in the memory device. The bit line voltage generating circuit includes an operational amplifier configured to receive a reference voltage, a feedback voltage, and a compensation current and output an output voltage, and an output transistor configured to provide a terminal voltage as the feedback voltage and the output voltage as a target voltage that is associated with the clamping voltage. The operational amplifier is configured to be unbalanced such that the terminal voltage is smaller than the reference voltage, and the compensation current is configured to compensate the operational amplifier such that the clamping voltage is substantially constant and independent from PVT (Process-Voltage-Temperature) effect.

20 Claims, 11 Drawing Sheets

(58) Field of Classification Search
CPC .. G05F 3/247; H03F 3/45269; H03F 3/45183; G06F 1/30
USPC .................................................. 365/189.09
See application file for complete search history.

(56) References Cited

U.S. PATENT DOCUMENTS

| | | |
|---|---|---|
| 7,082,061 B2 | 7/2006 | Chou et al. |
| 7,085,943 B2 * | 8/2006 | Chun ................... G06F 1/3237 713/300 |
| 7,142,464 B2 * | 11/2006 | Dadashev ........... G11C 11/5642 365/194 |
| 7,876,637 B2 * | 1/2011 | Hirobe ................ G11C 11/4074 365/208 |
| 7,969,779 B2 | 6/2011 | Fisch et al. |
| 8,559,248 B2 | 10/2013 | Liiu et al. |
| 9,202,531 B2 | 12/2015 | Seo |
| 9,887,011 B1 | 2/2018 | Hung |
| 2002/0130646 A1 * | 9/2002 | Zadeh ..................... G05F 1/575 323/275 |
| 2018/0120882 A1 | 5/2018 | Zhang et al. |

FOREIGN PATENT DOCUMENTS

| | | |
|---|---|---|
| TW | M359871 U1 | 6/2009 |
| TW | 201217933 | 5/2012 |
| TW | 201701101 A | 1/2017 |
| TW | I611283 | 1/2018 |

* cited by examiner

MANAGING BIT LINE VOLTAGE GENERATING CIRCUITS IN MEMORY DEVICES

CROSS-REFERENCE TO RELATED APPLICATION

This application claims priority under 35 USC § 119(e) to U.S. Provisional Patent Application Ser. No. 62/908,605, filed on Oct. 1, 2019, the entire content of which is hereby incorporated by reference.

BACKGROUND

Integrated circuit memory devices are becoming smaller and faster. One limitation on the size and speed of memory devices arises from circuitry used for providing a stable bit line clamping voltage for sensing data in a memory. A bit line voltage generating circuit is usually used to maintain a bit line of a memory cell in the memory at a stable clamping voltage. In some cases, a bandgap buffer is adopted between a bandgap reference system and the bit line voltage generating circuit for converting a bandgap reference voltage from the bandgap reference system into a lower voltage to generate the bit line clamping voltage. However, the bandgap buffer can occupy a large area of the memory and need a long setup time. Therefore, it would be desirable to develop a bit line voltage generating circuit that can provide a stable clamping voltage with a faster setup time and a smaller memory area.

SUMMARY

The present disclosure describes systems and techniques for managing bit line voltage generating circuits in memory devices, e.g., non-volatile memory devices like flash memories.

One aspect of the present disclosure features an integrated circuit including: an operational amplifier having a first input for receiving a reference voltage, a second input for receiving a feedback voltage, a third input for receiving a compensation current, and an output for outputting an output voltage; and an output transistor having a first terminal coupled to the output of the operational amplifier and configured to provide the output voltage as a target voltage, and a second terminal coupled to the second input of the operational amplifier and configured to provide a terminal voltage as the feedback voltage to the operational amplifier. The operational amplifier is configured to be unbalanced such that the terminal voltage is smaller than the reference voltage, and the compensation current is configured to compensate the operational amplifier such that the terminal voltage is substantially constant.

In some examples, the reference voltage is constant and independent from PVT (Process-Voltage-Temperature) effect, and the compensation current is sufficient to reduce the PVT effect on the operational amplifier to thereby enable the terminal voltage to be substantially independent from the PVT effect. The operational amplifier can be inversely affected by temperature and process effects, the compensation current can be configured to be inversely affected by the temperature and process effects, and a voltage difference between the reference voltage at the first input and the feedback voltage at the second input of the operational amplifier can be substantially independent from the PVT effect.

In some implementations, the output transistor is coupled to a clamping transistor configured to receive the target voltage at a first terminal of the clamping transistor that corresponds to the first terminal of the output transistor and output a clamping voltage at a second terminal of the clamping transistor that corresponds to the second terminal of the output transistor. The target voltage can equal a sum of the terminal voltage and a threshold voltage of the output transistor and equals a sum of the clamping voltage and a threshold voltage of the clamping transistor, and the output transistor and the clamping transistor can have substantially same characteristics, such that the threshold voltage of the clamping transistor can be substantially same as the threshold voltage of the output transistor and thus the clamping voltage can be substantially identical to the terminal voltage and substantially constant and independent from PVT effect. In some examples, the output transistor and the clamping transistor are n-channel transistors, and the first terminal is a gate terminal and the second terminal is a source terminal.

In some implementations, the operational amplifier includes: a first half bridge coupled to the first input and a second half bridge coupled to the second input, where the first half bridge and the second half bridge are configured to be different from each other. The operational amplifier can be configured such that the first half bridge carries a first current and the second half bridge carries a second current that is different from the first current. The compensation current can be associated with the first current and the second current.

In some examples, the first half bridge and the second half bridge have different number of transistors. In some examples, transistors in the first half bridge and transistors in the second half bridge have at least one of different widths, different lengths, or different ratios between widths and lengths. In some examples, the first half bridge includes a first upper circuit and a first lower circuit and the second half bridge includes a second upper circuit and a second lower circuit, and the first half bridge being different from the second half bridge includes at least one of the first lower circuit being different from the second lower circuit or the first upper circuit being different from the second upper circuit.

The reference voltage can be provided by a reference voltage system, and the compensation current can be provided by a compensation current circuitry in the reference voltage system.

Another aspect of the present disclosure features a memory device including: a memory cell array including a plurality of memory cells, a plurality of memory cell lines connecting respective lines of memory cells in the memory cell array, and a bit line voltage generating circuit configured to provide a bit line clamping voltage (or a bit line regulator voltage) to at least one of the memory cell lines. The bit line voltage generating circuit includes: an operational amplifier configured to receive a reference voltage, a feedback voltage, and a compensation current and output an output voltage, and an output transistor coupled to the operational amplifier and configured to provide a terminal voltage as the feedback voltage to the operation amplifier and to provide the output voltage as a target voltage, the clamping voltage being associated with the target voltage. The operational amplifier is configured to be unbalanced such that the terminal voltage is smaller than the reference voltage, and the compensation current is configured to compensate the operational amplifier such that the clamping voltage is substantially constant.

In some implementations, the memory device further includes a clamping transistor coupled to the output transistor and configured to receive the target voltage and output the clamping voltage to a corresponding memory cell line of the memory cell lines. The target voltage can be identical to a sum of the terminal voltage and a threshold voltage of the output transistor and identical to a sum of the clamping voltage and a threshold voltage of the clamping transistor, and where the output transistor and the clamping transistor have substantially same characteristics, such that the threshold voltage of the clamping transistor is substantially same as the threshold voltage of the output transistor and thus the clamping voltage is substantially identical to the terminal voltage.

In some implementations, the memory device further includes a comparator configured to: compare a cell voltage at a first input coupled to the corresponding memory cell line and the clamping transistor and a reference voltage at a second input, and output a result of the comparison indicating a value of data stored in a memory cell coupled to the corresponding memory cell line.

In some implementations, the memory device further includes a line decoder, through which the bit line voltage generating circuit provides the clamping voltage to the at least one of the memory cell lines when at least one memory cell connected to the at least one of the memory cell lines is in a read operation.

The reference voltage can be constant and independent from PVT (Process-Voltage-Temperature) effect, and the compensation current is capable of cancelling the PVT effect on the operational amplifier to thereby enable the clamping voltage to be substantially constant and independent from the PVT effect.

In some implementations, the memory device further includes a compensation current circuitry configured to provide the compensation current to the operational amplifier. The operational amplifier can be inversely affected by temperature and process effects, and the compensation current circuitry can be configured to enable the compensation current to be inversely affected by the temperature and process effects, such that a voltage difference between the reference voltage and the feedback voltage can be substantially independent from PVT effect.

In some implementations, the memory device further includes a bandgap reference system configured to provide the reference voltage and the compensation current to the operational amplifier.

In some implementations, the operational amplifier includes: a first half bridge coupled to the first input and a second half bridge coupled to the second input, where the first half bridge and the second half bridge are configured to be different from each other. The operational amplifier can be configured such that the first half bridge carries a first current and the second half bridge carries a second current that is different from the first current. The first half bridge being different from the second half bridge can include at least one of: a number of transistors in the first half bridge and a number of transistors in the second half bridge being different, or transistors in the first half bridge and transistors in the second half bridge having different widths, different lengths, or different ratios between width and length.

A further aspect of the present disclosure features a method of managing a bit line voltage generating circuit including: receiving, by an operational amplifier in the bit line voltage generating circuit, a bandgap reference voltage, a feedback voltage, and a compensation current, the bandgap reference voltage being constant; providing, by the operational amplifier, an output voltage to a gate terminal of an output transistor in the bit line voltage generating circuit; providing, by the output transistor, a terminal voltage at a source terminal of the output transistor as the feedback voltage to the operational amplifier; and outputting, by the output transistor, the output voltage as a target voltage to a gate terminal of a clamping transistor coupled to the gate terminal of the output transistor, a source terminal of the clamping transistor being connected to a bit line of memory cells in a memory system and providing a clamping voltage to the bit line. The operational amplifier can be configured to be unbalanced such that the terminal voltage is smaller than the reference voltage. The target voltage can be identical to a sum of the terminal voltage and a threshold voltage of the output transistor and identical to a sum of the clamping voltage and a threshold voltage of the clamping transistor. The output transistor and the clamping transistor can have substantially same characteristics, such that the threshold voltage of the clamping transistor can be substantially same as the threshold voltage of the output transistor and thus the clamping voltage can be substantially identical to the terminal voltage. The compensation current can be configured to compensate the operational amplifier such that the clamping voltage can be substantially constant.

Implementations of the above techniques include methods, systems, circuits, computer program products and computer-readable media. In one example, a method can be performed in a non-volatile memory and the method can include the above-described actions, e.g., the actions for managing bit line voltage generating circuits. In another example, one such computer program product is suitably embodied in a non-transitory machine-readable medium that stores instructions executable by one or more processors. The instructions are configured to cause the one or more processors to perform the above-described actions. One such computer-readable medium stores instructions that, when executed by one or more processors, are configured to cause the one or more processors to perform the above-described actions.

The techniques can be implemented for any type of circuits or devices that need stable voltages, particularly voltages independent from the PVT (Process-Voltage-Temperature) effect. For example, in a flash memory, a bit line voltage generating circuit can directly receive a stable bandgap reference voltage from a bandgap reference system, without using a bandgap buffer, and generate a stable bit line clamping voltage (or bit line regulator voltage). The bit line voltage generating circuit can include an unbalanced operational amplifier configured to receive a compensation current. The compensation current can be configured to compensate the PVT effect on the unbalanced operational amplifier such that the clamping voltage is substantially constant and independent from the PVT effect. The unbalanced operational amplifier can be also configured such that the clamping voltage reaches a desired value, e.g., 0.95 V, compared to the bandgap reference voltage, e.g., 1 V. The bit line clamping voltage generated by the bit line voltage generating circuit can be provided to a number of bit lines in the flash memory, thus the flash memory can greatly reduce the size and the setup time. The compensation current can be implemented by any suitable circuitry, for example, by a compensation current circuitry in a bandgap reference system, which can further reduce the size of the flash memory.

The techniques can be implemented with any types of memory transistors (or memory cells), any types of metal-oxide-silicon (MOS) transistors, e.g., n-channel and/or p-channel transistors, any types of bipolar junction transistors (BJTs), and any types of operational amplifiers. The techniques can be applied to various memory types, such as SLC (single-level cell) devices, or MLC (multi-level cell) devices like 2-level cell devices or TLC (triple-level cell) devices. The techniques can be applied to various types of non-volatile memory devices, such as NOR flash memory, NAND flash memory, resistive random-access memory (RRAM), phase-change random-access memory (PCRAM), among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

DETAILED DESCRIPTION

Figure 1A:
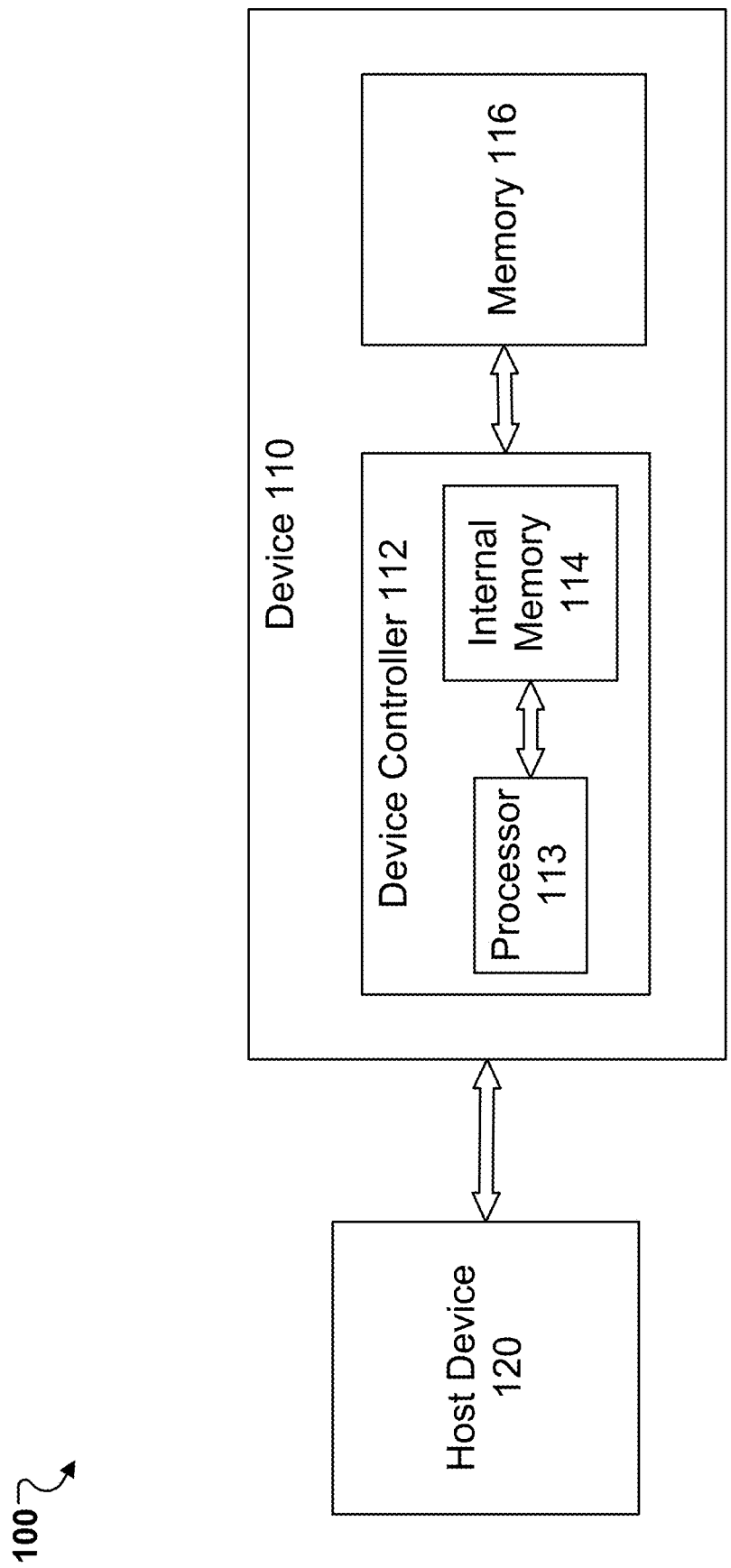
FIG. 1A illustrates an example of a system including a memory system, according to one or more implementations.

FIG. 1A illustrates an example of a system 100. The system 100 includes a device 110 and a host device 120. The device 110 can be a memory system including a device controller 112 and a memory 116. The device controller 112 includes a processor 113 and an internal memory 114.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. In some implementations, the memory 116 is a non-volatile memory that is configured for long-term storage of instructions and/or data, e.g., a NOR flash memory device, or some other suitable non-volatile memory device. In implementations where the memory 116 is NOR flash memory, the device 110 is a flash memory device, e.g., a flash memory card, and the device controller 112 is a NOR flash controller. For example, in some implementations, when the device 110 is an eMMC or an SD card, the memory 116 is a NOR flash; in some implementations, when the device 110 is a digital camera, the memory 116 is an SD card; and in some implementations, when the device 110 is a media player, the memory 116 is a hard disk. For illustration purposes only, the following description uses a NOR flash memory as an example of the memory 116.

Figure 1B:
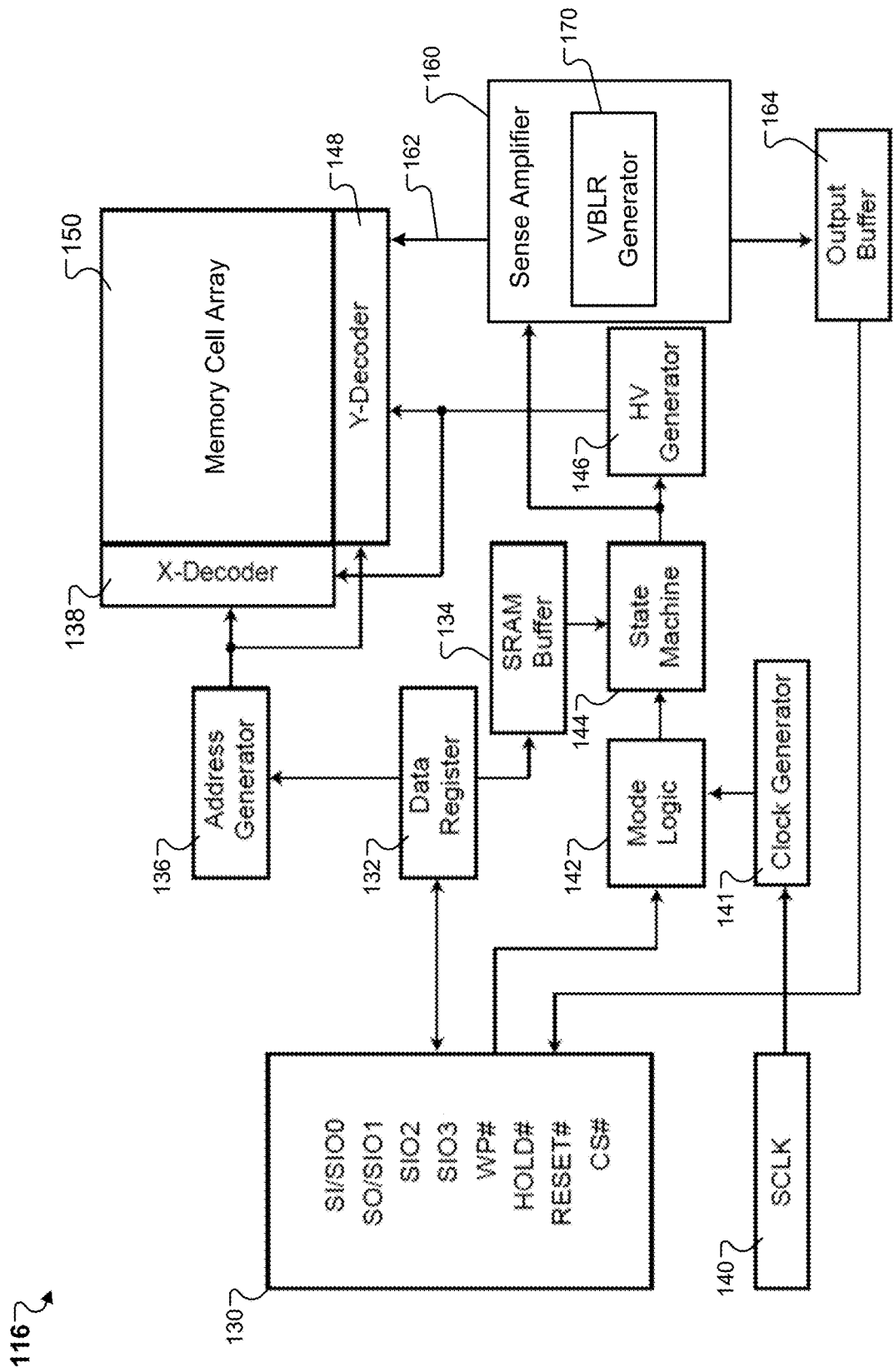
FIG. 1B illustrates a block diagram of an example memory including a bit line regulator voltage (VBLR) generator, according to one or more implementations.
Figure 1C:
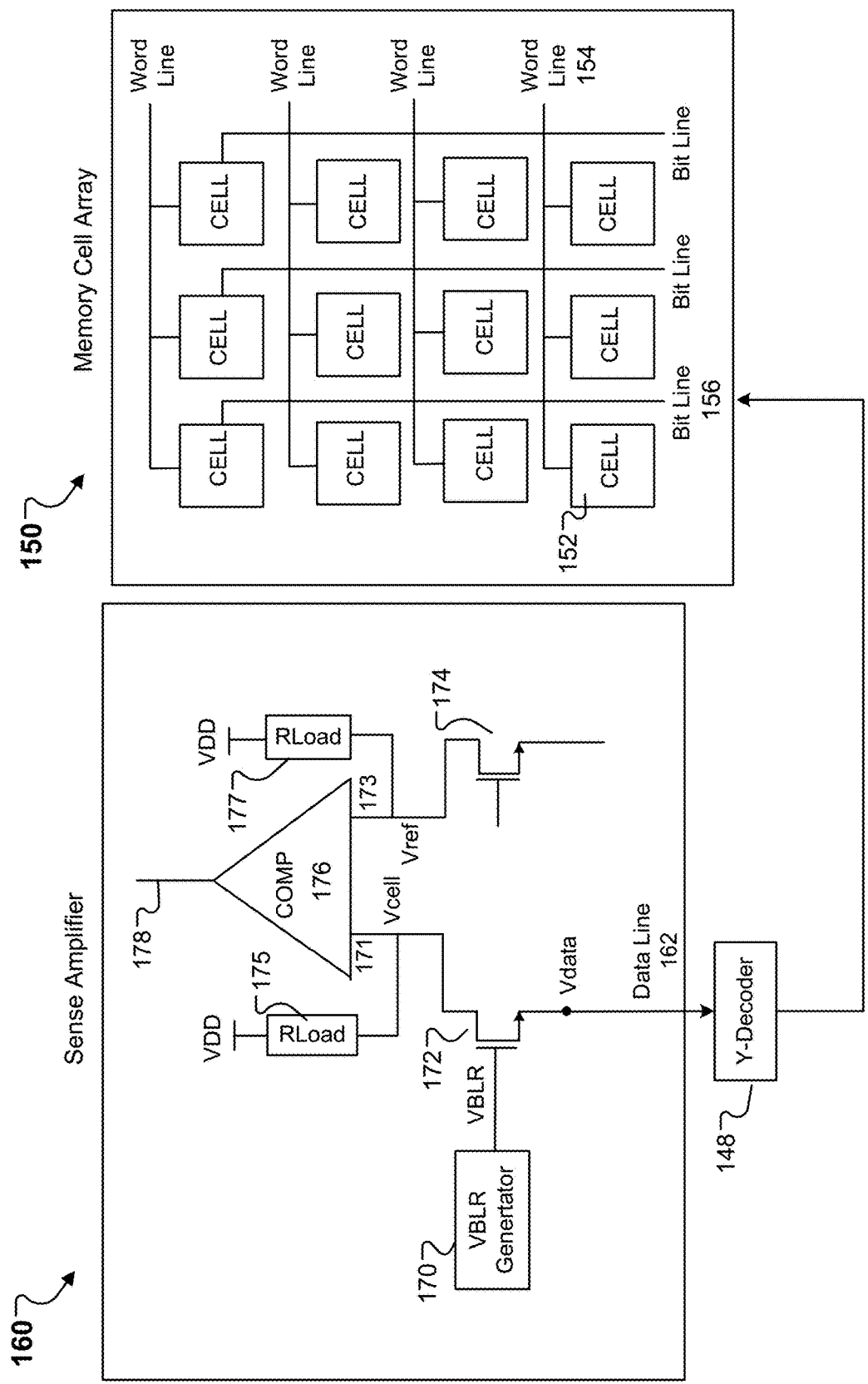
FIG. 1C illustrates a schematic diagram an example sensor amplifier including a bit line regulator voltage (VBLR) generator connected with a memory cell array, according to one or more implementations.

FIG. 1B illustrates an example configuration of the memory 116 having a memory cell array 150. As illustrated in FIG. 1C, the memory cell array 150 includes a number of memory cells 152 coupled in series to a number of row word lines 154 and a number of column bit lines 156. A memory cell 152 can include a memory transistor configured as a storage element. The memory transistor can include a silicon-oxide-nitride-oxide-silicon (SONOS) transistor, a floating gate transistor, a nitride read only memory (NROM) transistor, or any suitable non-volatile memory MOS device that can store charges.

The memory 116 further includes an X-decoder (or row decoder) 138 and a Y-decoder (or column decoder) 148. Each memory cell 152 is coupled to the X-decoder 138 via a respective word line 154 and coupled to the Y-decoder 148 via a respective bit line 156. Accordingly, each memory cell 152 can be selected by the X-decoder 138 and the Y-decoder 148 for read or write operations through the respective word line 154 and the respective bit line 156.

The memory 116 includes a memory interface 130 having multiple pins, including SI/SIO0 for serial data input/serial data input & output, SO/SIO1 for serial data output/serial data input &output, SIO2 for serial data input or output, WP # for write protection active low, Hold # for a holding signal input, RESET # for hardware reset pin active low, and CS # for chip select.

The memory 116 can include a data register 132, an SRAM buffer 134, an address generator 136, an SCLK 140, a clock generator 141, a mode logic 142, a state machine 144, and a high voltage (HV) generator 146. The SCLK 140 is configured to receive a synchronous clock input and the clock generator 141 is configured to generate a clock signal for the memory 116 based on the synchronous clock input. The mode logic 142 is configured to determine whether there is a read or write operation and provide a result of the determination to the state machine 144. The memory 116 can also include a sensor amplifier 160 that is connected to the Y-decoder 148 by a data line 162 and an output buffer 164 for buffering an output signal from the sensor amplifier 160 to the memory interface 130.

During a write operation, the data register 132 registers input data from the memory interface 130, and the address generator 136 generates corresponding physical addresses to store the input data in specified memory cells 152 of the memory cell array 150. The address generator 136 is connected to the X-decoder 138 and Y-decoder 148 that are controlled to select the specified memory cells 152 through corresponding word lines 154 and bit lines 156. The SRAM buffer 134 can retain the input data from the data register 132 in its memory as long as power is being supplied. The state machine 144 processes a write signal from the SRAM buffer 134 and provides a control signal to the HV generator 146 that generates a write voltage and provides the write voltage to the X-decoder 138 and the Y-decoder 148. The Y-decoder 148 is configured to output the write voltage to the bit lines 156 for storing the input data in the specified memory cells 152.

During a read operation, the state machine 144 provides control signals to the HV generator 146 and the sense amplifier 160. The HV generator 146 can provide a voltage to the X-decoder 138 and the Y-decoder 148 for selecting a memory cell 152. The sense amplifier 160 senses a small power (voltage or current) signal from a bit line that represents a data bit (1 or 0) stored in the selected memory cell 152 and amplify the small power signal swing to recognizable logic levels so the data bit can be interpreted properly by logic outside the memory 116. The output buffer 164 receives the amplified voltage from the sensor amplifier 160 and outputs the amplified power signal to the logic outside the memory 116 through the memory interface 130.

In some implementations, as illustrated in FIG. 1B, the sense amplifier 160 includes a bit line regulator voltage (VBLR) generator (or generating circuit) 170 configured to provide a stable clamping voltage to the bit line through the Y-decoder 148 for reading the data from the selected memory cell. In some other implementations, the VBLR generator 170 is externally connected to the sensor amplifier 160 and the Y-decoder 148. The VBLR generator 170 can be configured to provide a stable clamping voltage to multiple bit lines through the Y-decoder 148 for individually (or in parallel or simultaneously) reading data from multiple selected memory cells corresponding to the multiple bit lines.

FIG. 1C illustrates an example of the sensor amplifier 160 including the VBLR generator 170. The VBLR generator 170 can be electrically coupled to a clamping transistor 172. The clamping transistor 172 can be an n-channel transistor, e.g., NMOS transistor. The clamping transistor 172 is configured to receive an output voltage VBLR from the VBLR generator 170 at a gate terminal and generate a data voltage Vdata at a source terminal. The data voltage Vdata is considered as the bit line clamping voltage to be provided to a bit line 156 in the memory cell array 150 through the data line 162 and the Y-decoder 148. The VBLR generator 170 can be electrically coupled to multiple bit lines through multiple clamping transistors and the Y-decoder 148 and provide the stable clamping voltage to the multiple bit lines for reading data, e.g., in parallel, from the multiple bit lines.

In some implementations, the sensor amplifier 160 includes a comparator 176 having a first input 171 and a second input 173. The first input 171 is coupled to a drain terminal of the clamping transistor 172 and configured to receive a cell voltage Vcell from the bit line 156 through the clamping transistor 172. The second input 173 is coupled to a drain terminal of a reference transistor 174 and configured to receive a reference voltage Vref During a read operation, the comparator 176 is configured to compare the cell voltage Vcell at the first input 171 and the reference voltage Vref at the second input 173 and output an output signal at an output 178. The output signal corresponds to a voltage difference between the cell voltage Vcell and the reference voltage Vref. The output signal from the comparator 176 can be further sent to an amplifier in the sensor amplifier 160. The output signal corresponds to a value of data (1 or 0) stored in a memory cell 152 connected to the bit line 156. A supply voltage VDD can be provided to the first input 171 and the second input 173 of the comparator 176 through respective loads (e.g., resistors) 175, 177. The loads 175 and 177 can be configured such that voltages at the first input 171 and the second input 173 are equal at an initial condition, that is, before the memory cell 152 is in a read operation or before the sense amplifier 160 senses the memory cell 152.

Each bit line 156 can be connected to a respective clamping transistor 172. The memory 116 can be configured to perform parallel read operations on multiple bit lines by using multiple clamping transistors 172 (and/or multiple comparators 176) that are coupled to the VBLR generator 170. Thus, the total size of the memory 116 can be greatly reduced.

Figure 2:
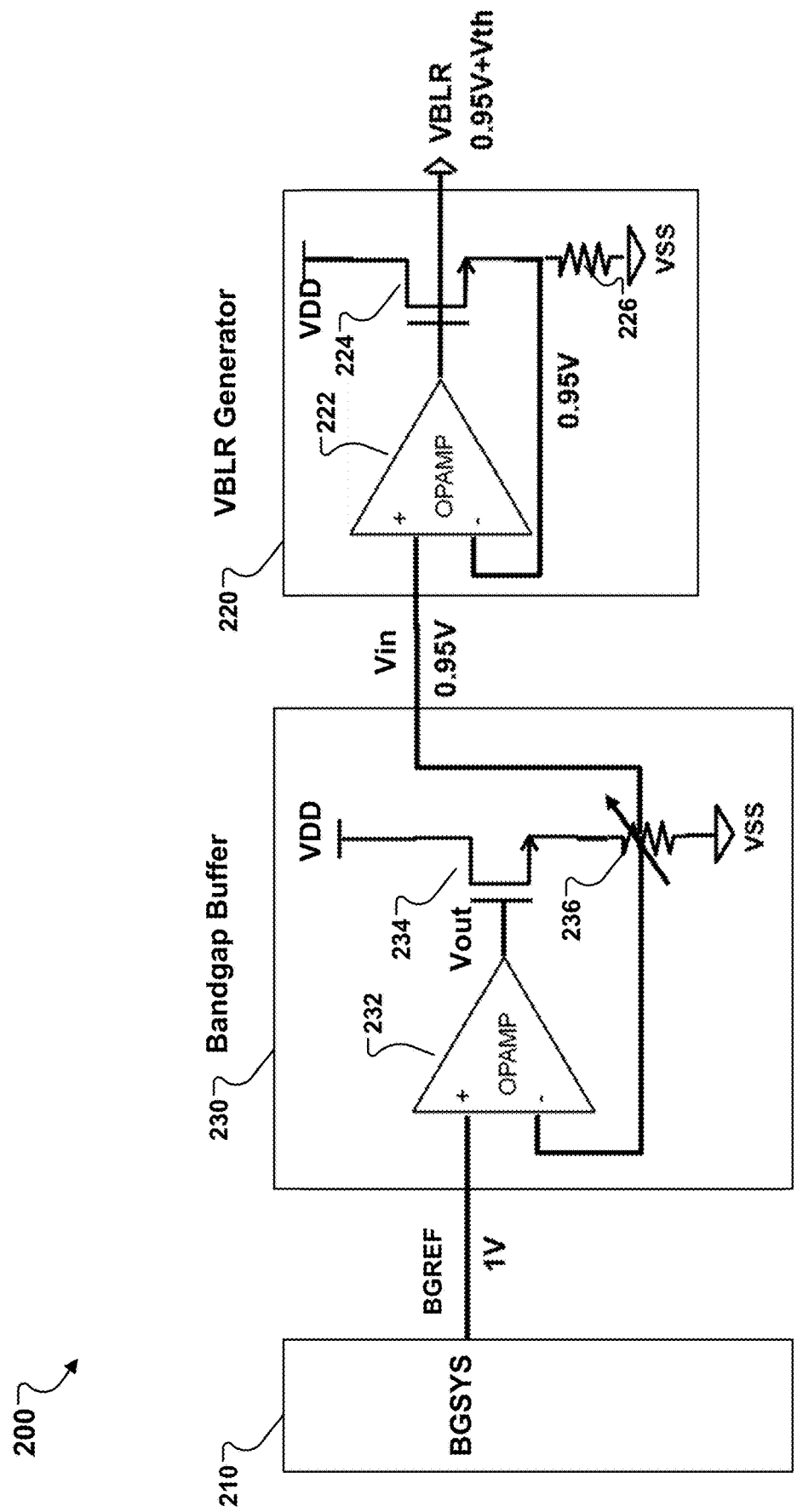
FIG. 2 shows a circuit diagram illustrating an example voltage system including a bit line regulator voltage (VBLR) generator and a bandgap buffer.

FIG. 2 shows an example diagram illustrating a voltage system 200. The voltage system 200 includes a bandgap system (BGSYS) 210, a VBLR generator 220 and a bandgap buffer 230. The bandgap buffer 230 is connected to the bandgap system (BGSYS) 210 and configured to receive a bandgap reference (BGREF) voltage from the bandgap system 210. The bandgap reference system 210 is configured to keep the bandgap reference voltage stable (or constant) under different PVT conditions, i.e., independent from PVT effect.

The bandgap buffer 230 is configured to provide a desired voltage that is smaller than the bandgap reference voltage. In some examples, the bandgap reference voltage is 1 V, and the desired voltage is 0.95 V. The bandgap buffer 230 includes an operational amplifier (OPAMP) 232, a transistor 234, and a variable resistor 236. The variable resistor 236 is coupled to a negative supply terminal Vss, e.g., 0 V or ground. The operational amplifier 232 is configured to receive the bandgap reference voltage at a positive input and a feedback voltage at a negative input and output an output voltage to the transistor 234. The transistor 234 can be an n-channel transistor and can be configured to receive the output voltage from the operational amplifier 232 at a gate terminal and a supply voltage at a drain terminal and to output a source voltage at a source terminal that is connected to the variable resistor 236. The negative input of the operational amplifier 232 is connected to a variable portion of the resistor 236. By adjusting a resistance of the variable portion of the resistor 236, the feedback voltage can be adjusted to the desired voltage, e.g., 0.95 V.

The VBLR generator 220 includes a balanced operational amplifier 222, an output transistor 224, and a resistor 226. The resistor 226 is coupled to the negative supply terminal Vss. The operational amplifier 222 is configured to receive the desired voltage Vin at the positive input and a feedback voltage from the output transistor 224 at the negative input and to output an output voltage at an output. The output transistor 224 has a gate terminal connected to the output of the operational amplifier 222 and is configured to output the output voltage as a target voltage VBLR, e.g., to a clamping transistor such as the clamping transistor 172 of FIG. 1C. The operational amplifier 222 is balanced such that the feedback voltage is identical to the desired voltage Vin. The target voltage VBLR is identical to a sum of the feedback voltage and a threshold voltage Vth of the output transistor 224. For example, the desired voltage is 0.95V, and the target voltage VBLR is 0.95V+Vth. The output transistor 224 can receive the target voltage VBLR and generate a bit line clamping voltage.

Although the voltage system 200 can provide the target voltage VBLR for generating the bit line clamping voltage, the bandgap buffer 230 can occupy a large memory area and need a long setup time.

Implementations of the present disclosure provide a bit line voltage generating circuit that can generate a stable bit line clamping voltage (or bit line regulator voltage) with a smaller memory area and a faster setup time. Instead of using a bandgap buffer, the bit line voltage generating circuit includes an unbalanced operational amplifier with an input of a compensation current to offer a stable bit line clamping voltage independent from PVT effect, which can effectively save the memory area of the bandgap buffer and also reduce the setup time.

Figure 3A:
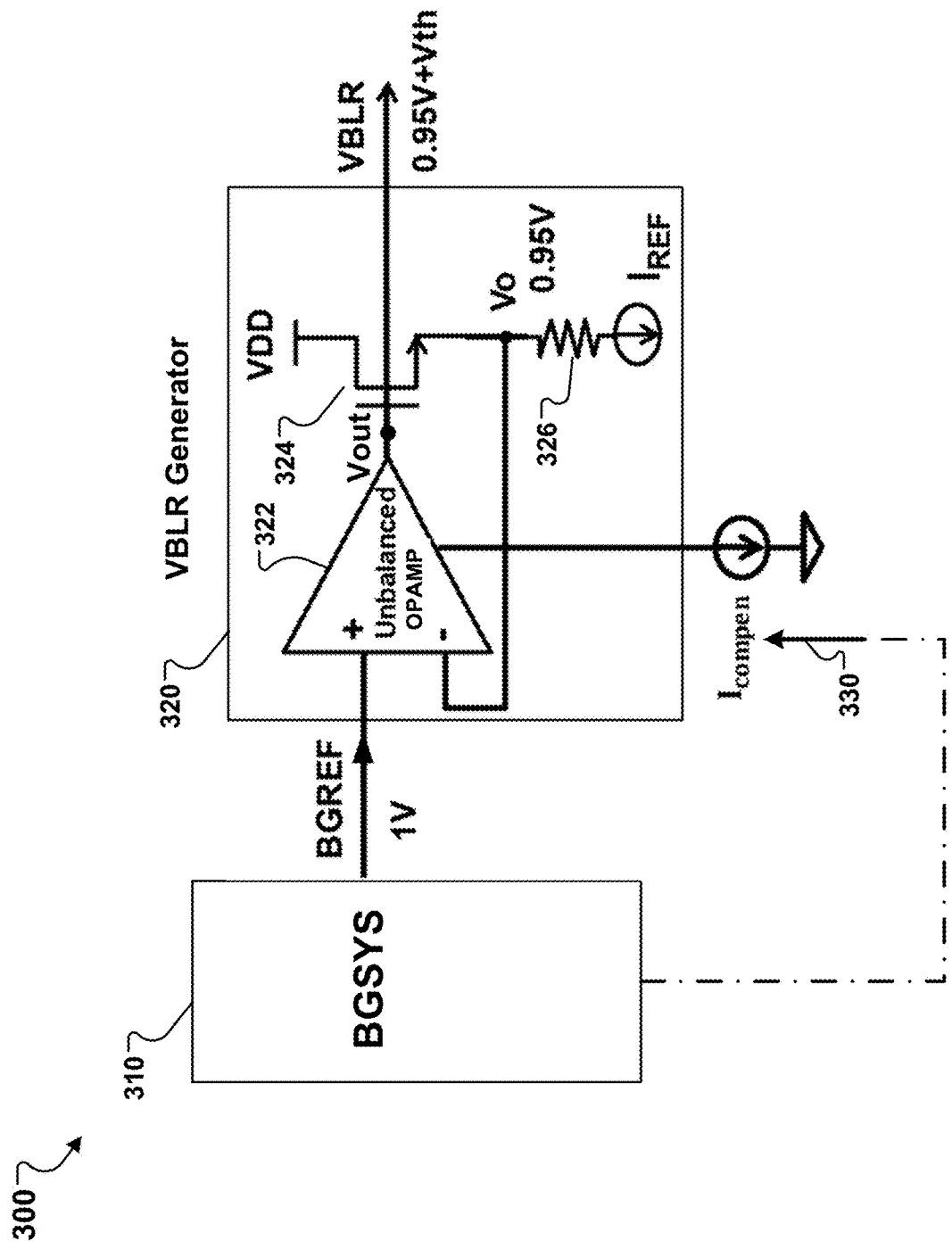
FIG. 3A shows a circuit diagram illustrating an example voltage system including a bit line regulator voltage (VBLR) generator without a bandgap buffer, according to one or more implementations.

FIG. 3A shows an example diagram of a voltage system 300 including a bit line regulator voltage generating circuit (or VBLR generator) 320 according to one or more implementations. The VBLR generator 320 can provide the VBLR generator 170 of FIGS. 1B and 1C. The VBLR generator 320 can provide a stable clamping voltage to at least one bit line of memory cells in a memory, e.g., the memory 116 of FIG. 1B. In contrast to the VBLR generator 220 of FIG. 2, the VBLR generator 320 includes an unbalanced operational amplifier 322 that is configured to directly receive a bandgap reference voltage from a bandgap reference system 310, without using a bandgap buffer, and receive an external compensation current Icompen 330.

The bandgap reference system 310 is configured to keep the bandgap reference voltage constant under different PVT conditions, e.g., the bandgap reference voltage will be independent from the PVT effect. The bandgap reference system 310 can be included in the memory, e.g., the memory 116 of FIG. 1B. The compensation current Icompen 330 can compensate, e.g., the PVT effect on, the unbalanced operational amplifier 322 such that a clamping voltage generated by the bit line VBLR generator 320 is substantially constant and independent from the PVT effect.

In some implementations, the VBLR generator 320 includes the unbalanced operational amplifier 322 and an output transistor 324 coupled to the unbalanced operational amplifier 322. The operational amplifier 322 is configured to receive the bandgap reference voltage from the bandgap reference system 310 at a first (positive) input, a feedback voltage from the output transistor 324 at a second (negative) input, the compensation current Icompen 330 from an external compensation current circuitry at a third input, and output an output voltage Vout at an output. The external compensation current circuitry can be included in the bandgap reference system 310 or another part of the memory.

The output transistor 324 includes a gate terminal coupled to the output of the operational amplifier 322 and is configured to receive the output voltage from the operational amplifier 322 and output the output voltage as a target voltage VBLR. The output transistor 324 receives a supply voltage VDD at a drain terminal and provides a source voltage Vo at a source terminal that is coupled to a resistor 326. The source voltage Vo is provided to the negative input of the operational amplifier 322 as the feedback voltage. The operational amplifier 322 is configured to be unbalanced such that the feedback voltage, e.g., 0.95 V at the negative input (and thus the source voltage Vo) is smaller than the bandgap reference voltage, e.g., 1 V, at the positive input. A resistance of the resistor 326 can be connected to a reference source. The target voltage VBLR is identical to a sum of the source voltage (or the feedback voltage) and a threshold voltage Vth of the output transistor 324, e.g., 0.95V+Vth.

As illustrated in FIG. 1C, the VBLR generator 320 can be coupled to a clamping transistor, e.g., the clamping transistor 172 of FIG. 1C. The clamping transistor can receive the target voltage VBLR at a gate terminal and provide a clamping voltage at a source terminal to the bit line of the memory. During a read operation, the clamping voltage is identical to the target voltage VBLR minus a threshold voltage of the clamping transistor. The output transistor 324 and the clamping transistor can be configured to have substantially same characteristics, such that the threshold voltage of the clamping transistor is substantially same as the threshold voltage Vth of the output transistor and thus the clamping voltage is substantially identical to the source voltage Vo, e.g., 0.95V. The output transistor 324 and the clamping transistor can be fabricated with same configurations at the same process, such that the characteristics of these two transistors can be substantially the same. The output transistor 324 and the clamping transistor can be n-channel transistors, e.g., NMOS transistors.

Figure 3B:
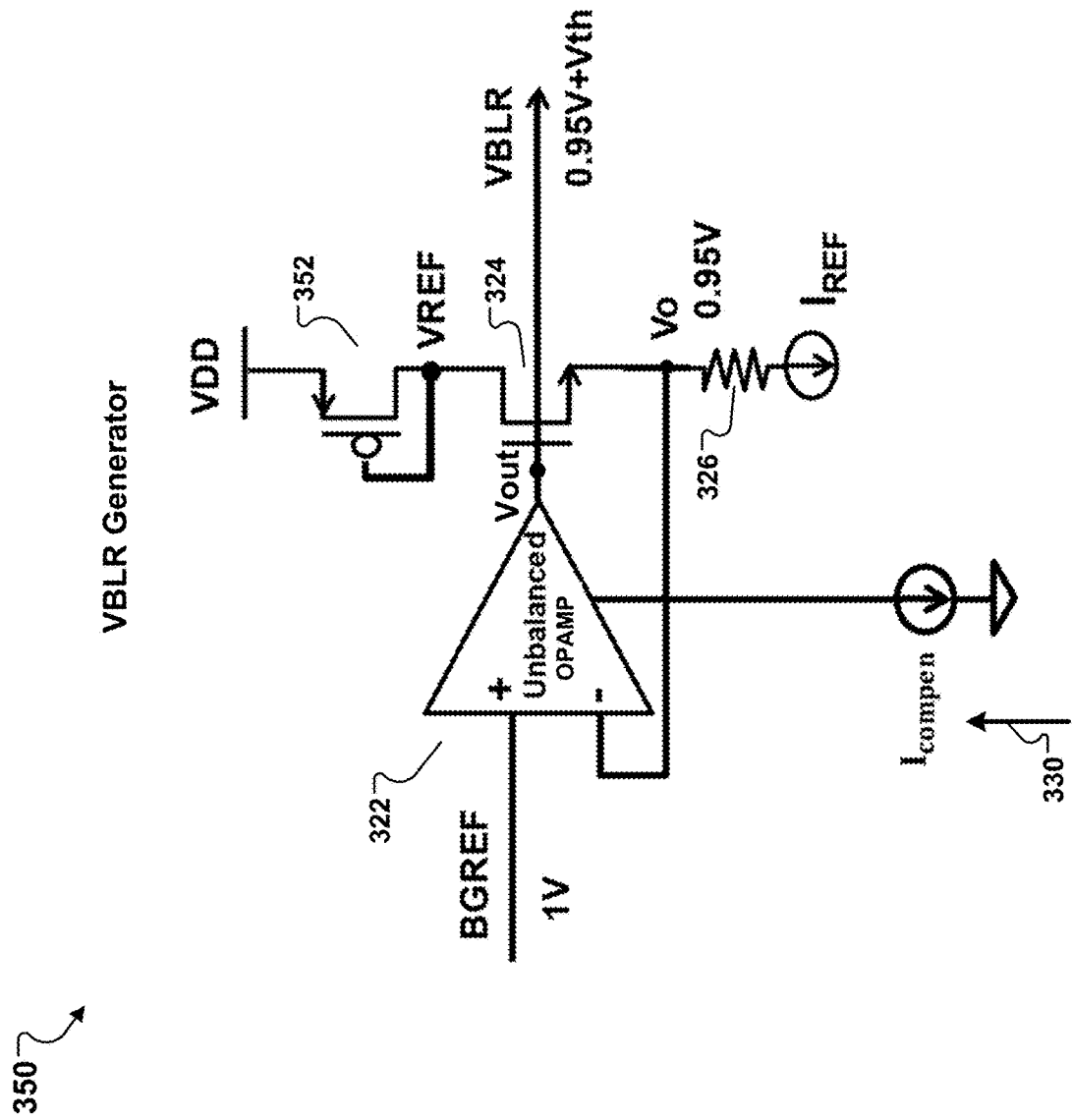
FIG. 3B shows another example circuit diagram of a bit line regulator voltage (VBLR) generator, according to one or more implementations.

FIG. 3B shows another example diagram of a bit line regulator voltage (VBLR) generator 350, according to one or more implementations. In contrast to the VBLR generator 320 of FIG. 3A, the VBLR generator 350 can include a load transistor 352, e.g., a p-channel transistor such as PMOS transistor. The load transistor 352 is configured to receive a supply voltage VDD at a source terminal and provide a biased reference bit line voltage VREF at a drain terminal to the drain terminal of the output transistor 324, where a gate terminal of the load transistor 352 is connected to the drain terminal of the load transistor 352.

Figure 4:
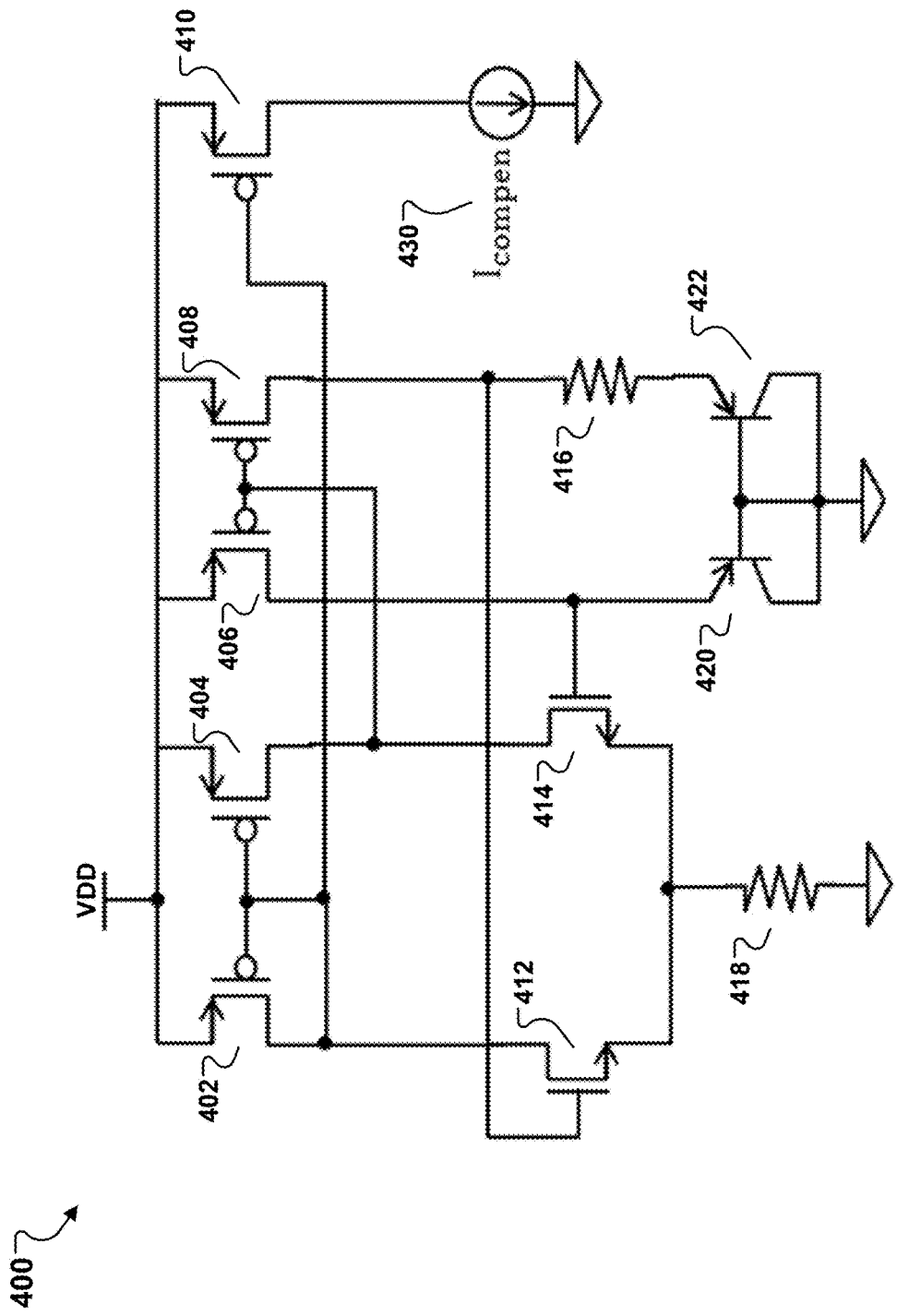
FIG. 4 shows an example circuit diagram of a compensation current circuitry, according to one or more implementations.

FIG. 4 shows an example diagram of a compensation current circuitry 400, according to one or more implementations. The compensation current circuitry 400 can be included in a bandgap reference system, e.g., the bandgap reference system 310 of FIGS. 3A-3B, which can further reduce a memory area. The compensation current circuitry 400 is configured to compensate PVT effect on an unbalanced operational amplifier, e.g., the operational amplifier 322 of FIGS. 3A-3B, in a bit line voltage generating circuit, e.g., the VBLR generator 320 of FIG. 3A or 350 of FIG. 3B.

In some implementations, the compensation current circuitry 400 includes five p-channel transistors 402, 404, 406, 408, 410, e.g., PMOS transistors, two n-channel transistors 412, 414, e.g., NMOS transistors, and two bipolar junction transistors (BJTs) 420, 422, e.g., PNP BJTs. Source terminals of the five p-channel transistors can be coupled to a same supply voltage VDD. Gate terminals of the two p-channel transistors 402 and 404 are connected. The gate terminal of the p-channel transistor 402 is also connected with a drain terminal of the p-channel transistor 402 that is connected to a drain terminal of the n-channel transistor 412. A drain terminal of the p-channel transistor 404 is connected to a drain terminal of the n-channel transistor 414. Both source terminals of the n-channel transistors 412 and 414 are connected together to a resistor 418 that is grounded. Gate terminals of the p-channel transistors 406 and 408 are connected together to the drain terminal of the p-channel transistor 404. A drain terminal of the p-channel transistor 406 is connected to the emitter (E) terminal of the BJT 402 and to a gate terminal of the n-channel transistor 414. A drain terminal of the p-channel transistor 408 is connected to the gate terminal of the n-channel transistor 412 and to the emitter terminal of the BJT 422 through a resistor 416. The base terminals of the BJTs 420 and 422 are connected with the collectors terminals the BJTs 420 and 422 to the ground. The p-channel transistor 410 has a gate terminal connected to the gate terminals of the p-channel transistors 402 and 404 and a drain terminal as an output to provide a compensation current Icompen 430.

The compensation current Icompen 430 can be expressed as:

$$I\text{compen}=(V_{BE}-V_T)/R \quad (1),$$

where $V_{BE}$ is the voltage that falls between the base and emitter of the BJT 420, $V_T$ is a threshold voltage of the n-channel transistor 412, 414, and R is a resistance of the resistor 418. The p-channel transistors 402, 404, the n-channel transistors 412, 414 and the resistor 418 form an operational amplifier. The gates of n-channel transistors 412, 414 are two inputs of the operational amplifier and can be pulled to a substantially same voltage, e.g., $V_{BE}$, due to a function of the operational amplifier. Thus, a current on the resistor 418 can be expressed as $(V_{BE}-V_T)/R$. The compensation current circuitry 400 is configured such that the compensation current Icompen 430 can mirror or be substantially identical to the current on the resistor 418. The voltage $V_{BE}$ may be inversely varied with temperature (T). The higher the temperature is, the lower $V_{BE}$ is. The threshold voltage $V_T$ may be inversely varied or shifted with manufacture process, which can be controlled within a certain range, that is, a process corner. The larger the process corner variation is, the threshold voltage $V_T$ is smaller. Thus, the compensation current Icompen 430 can be configured to be inversely affected by temperature (T) and process ($V_T$).

Figure 5A:
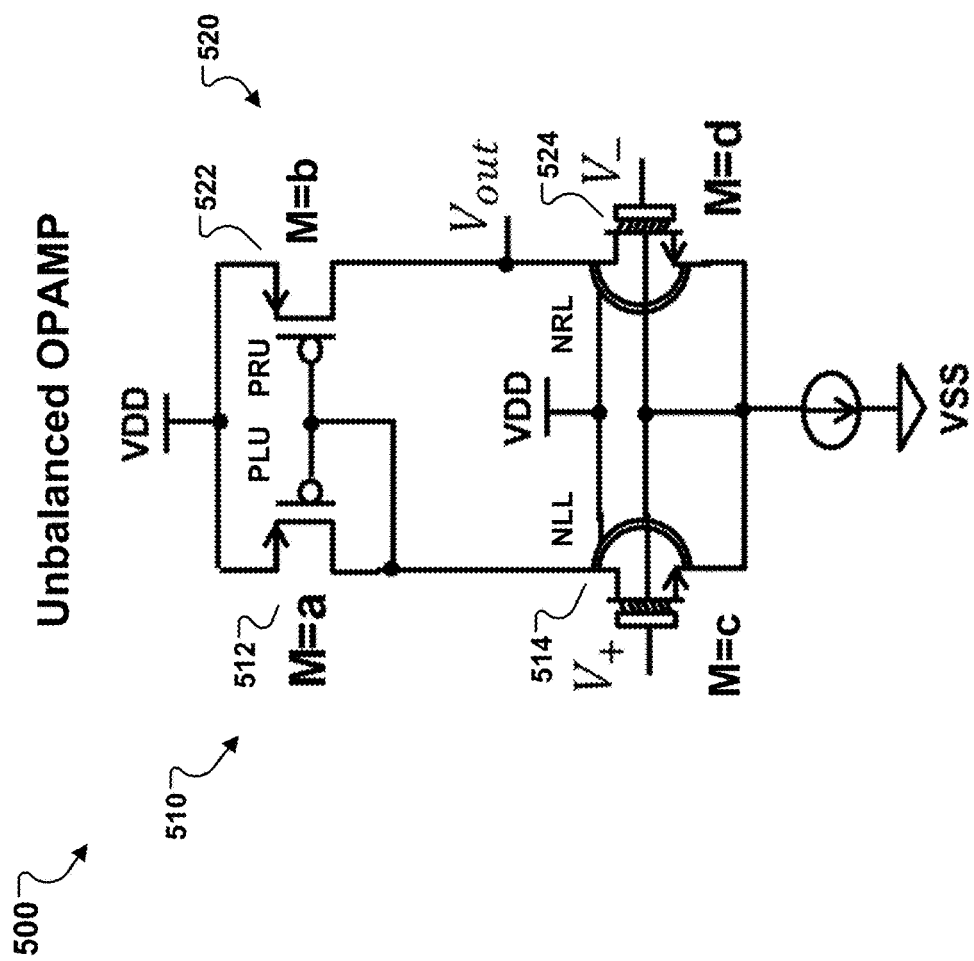
FIGS. 5A-5C show example circuit diagrams of unbalanced operational amplifiers in bit line voltage generating circuits, according to one or more implementations.

FIG. 5A shows an example diagram of an unbalanced operational amplifier 500, according to one or more implementations. The operational amplifier 500 can be the operational amplifier 322 of FIGS. 3A-3B. The operational amplifier 500 can include a left half bridge 510 coupled to a first (positive) input for receiving voltage V+, e.g., a bandgap reference voltage, and a right half bridge 520 coupled to a second (negative) input for receiving voltage V−, e.g., a feedback voltage. The operational amplifier 500 is configured to be unbalanced by configuring the left and right half bridges 510 and 520 to be different.

In some implementations, the left half bridge 510 includes a left upper circuit 512 and a left lower circuit 514, and the right half bridge 520 includes a right upper circuit 522 and a right lower circuit 524. The left upper circuit 512 can include a first number of p-channel transistors (M=a), and the left lower circuit 514 can include a third number of n-channel transistors (M=c). The right upper circuit 522 can include a second number of p-channel transistors (M=b), and the right lower circuit 524 can include a fourth number of n-channel transistors (M=d). The n-channel transistors in the left lower circuit 514 and the right lower circuit 524 can be triple-well transistors.

For simplicity, the first number of p-channel transistors can be represented by a representative p-channel transistor PLU, the second number of p-channel transistors can be represented by another representative p-channel transistor PRU, the third number of n-channel transistors can be represented by a representative n-channel transistor NLL, and the fourth number of n-channel transistors can be represented by another representative n-channel transistor NRL. As illustrated in FIG. 5A, source terminals of PLU and PRU are connected to a supply voltage VDD, gate terminal of PLU and PRU are connected together to a drain terminal of PLU. NLL has a drain terminal connected to the source terminal of PLU, a gate terminal used as the first input for receiving voltage V+, and a source terminal coupled to VSS. NRL has a drain terminal connected to a drain terminal of PRU, a gate terminal used as the second input for receiving voltage V−, and a source terminal coupled to VSS. NLL and NRL can have two other terminals connected together, one of which is connected to VDD and the other of which is connected to VSS. The operational amplifier 500 has an output positioned between the drain terminal of PRU and the drain terminal of NRL and used for providing an output voltage Vout.

The left and right half bridges 510 and 520 can be configured to be unbalanced in various ways. In some implementations, as FIG. 5B illustrates, transistors in the two half bridges 510 and 520 have the same width (W) and length (L), but the number of transistors in the two half bridges 510 and 520 can be different. In some examples, the first number of p-channel transistors (M=a) in the left upper circuit 512 is not identical to the second number of p-channel transistors (M=b) in the right upper circuit 522, that is, a≠b. In some examples, the third number of n-channel transistors (M=c) in the left lower circuit 514 is not identical to the fourth number of n-channel transistors (M=d) in the right lower circuit 524, that is, c≠d. In some examples, a≠b and c≠d.

Figure 5C:
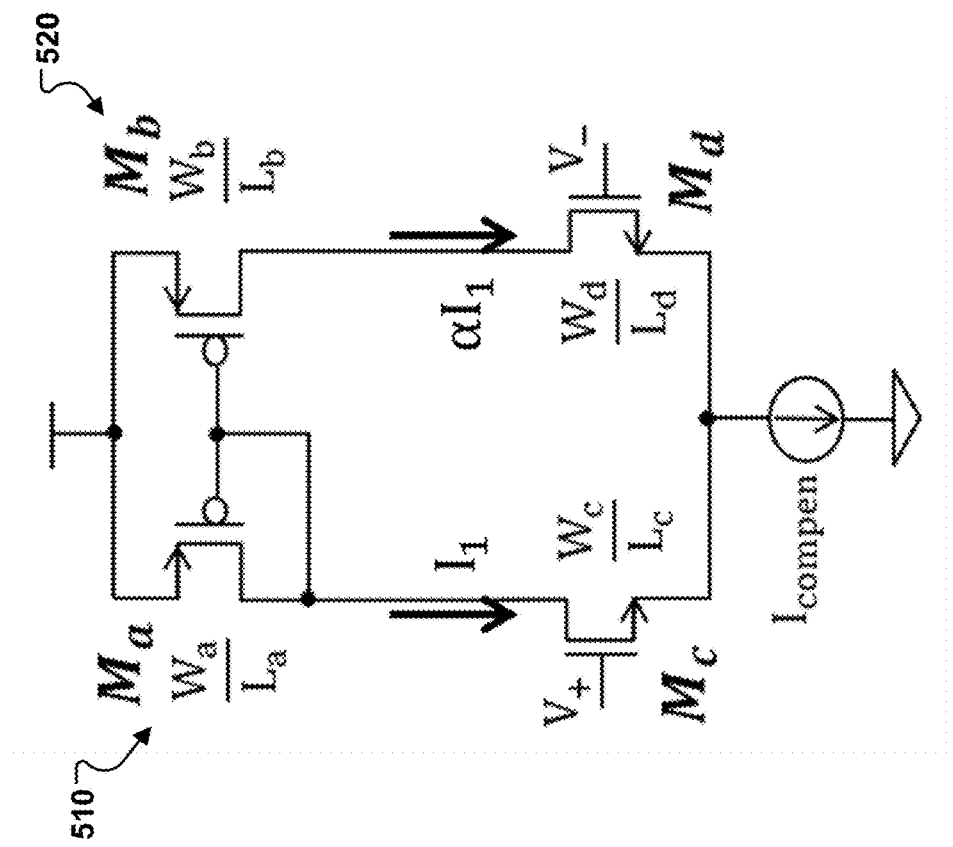
Figure 5B:
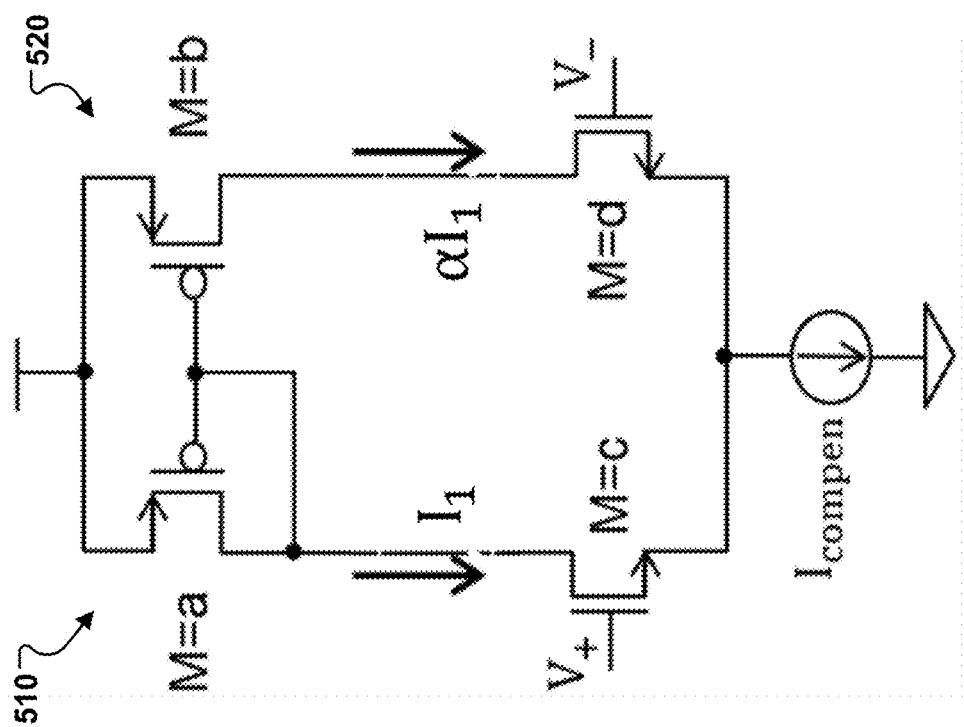

In some implementations, as FIG. 5C illustrates, transistors in the two half bridges 510 and 520 can have different widths (W), different lengths (L), or different ratios between width and length (W/L). In some examples, Wa/La of the representative p-channel transistor PLU in the left upper circuit 512 is not identical to Wb/Lb of the representative p-channel transistor PRU in the right upper circuit 522, that is, Wa/La≠Wb/Lb. In some examples, Wc/Lc of the representative n-channel transistor NLL in the left lower circuit 514 is not identical to Wd/Ld of the representative n-channel transistor NRL (M=d) in the right lower circuit 524, that is, Wc/Lc≠Wd/Ld. In some examples, Wa/La≠Wb/Lb and Wc/Lc≠Wd/Ld. The numbers of transistors in the two half bridges 510 and 520 can be also different, that is, a≠b, or c≠d, or both.

As noted above, the unbalanced operational amplifier 500 can receive a compensation current Icompen, e.g., Icompen 330 of FIGS. 3A-3B or Icompen 430 of FIG. 4. In operation, due to the unbalanced configuration of the left and right half bridges 510 and 520, currents in the left and right half bridges 510 and 520 are different. For example, the left half bridge 510 can carry a current $I_1$, and the second half bridge 520 can carry a current $\alpha\, I_1$ proportional to the current $I_1$, where $\alpha$ is not identical to 1, i.e., $\alpha>1$ or $\alpha<1$. The compensation current Icompen can be associated with $I_1$ and $\alpha\, I_1$, for example, identical to a sum of $I_1$ and $\alpha\, I_1$:

$$I\text{compen} = I_1 + \alpha I_1 \qquad (2)$$

A voltage difference $\Delta V$ between the first input and the second input of the unbalanced operational amplifier can be expressed as:

$$\Delta V = V+ - V-, \text{ and} \qquad (3)$$

$$\Delta V = \sqrt{\frac{2I_1}{\mu_n C_{ox} \frac{W}{L}}} - \sqrt{\frac{2\alpha I_1}{\mu_n C_{ox} \frac{W}{L}}}, \qquad (4)$$

where $\mu_n$ represents electric mobility in transistors, which can be inversely affected by temperature (T), Cox represents a gate oxide capacitance in transistors, which can be inversely affected by process ($V_T$).

According to the above expressions (2) and (4), the voltage different $\Delta V$ is positively affected by Icompen but inversely affected by $\mu_n$ and Cox (and thus by temperature (T) and process ($V_T$)). As noted above in FIG. 4, the compensation current Icompen can be configured to be inversely affected by temperature (T) and process ($V_T$). Thus, the voltage difference $\Delta V$ can be configured to be independent from temperature (T) and process ($V_T$) by configuring the compensation current Icompen. The voltage difference $\Delta V$ can be further independent from PVT effect by using a constant supply voltage, e.g., 3V. The operational amplifier 500 can receive at the first input a bandgap reference voltage that is constant and independent from PVT effect, i.e., V+ is independent from PVT. Thus, when $\Delta V$ is also independent from the PVT effect, the voltage V- (and the feedback voltage) is also independent from PVT. Also the operational amplifier can be configured to make $\Delta V$ be a specified value such that the feedback voltage at the second input can be a specified voltage, e.g., 0.95 V, compared to the bandgap reference voltage at the first input, e.g., 1 V.

Figure 6:
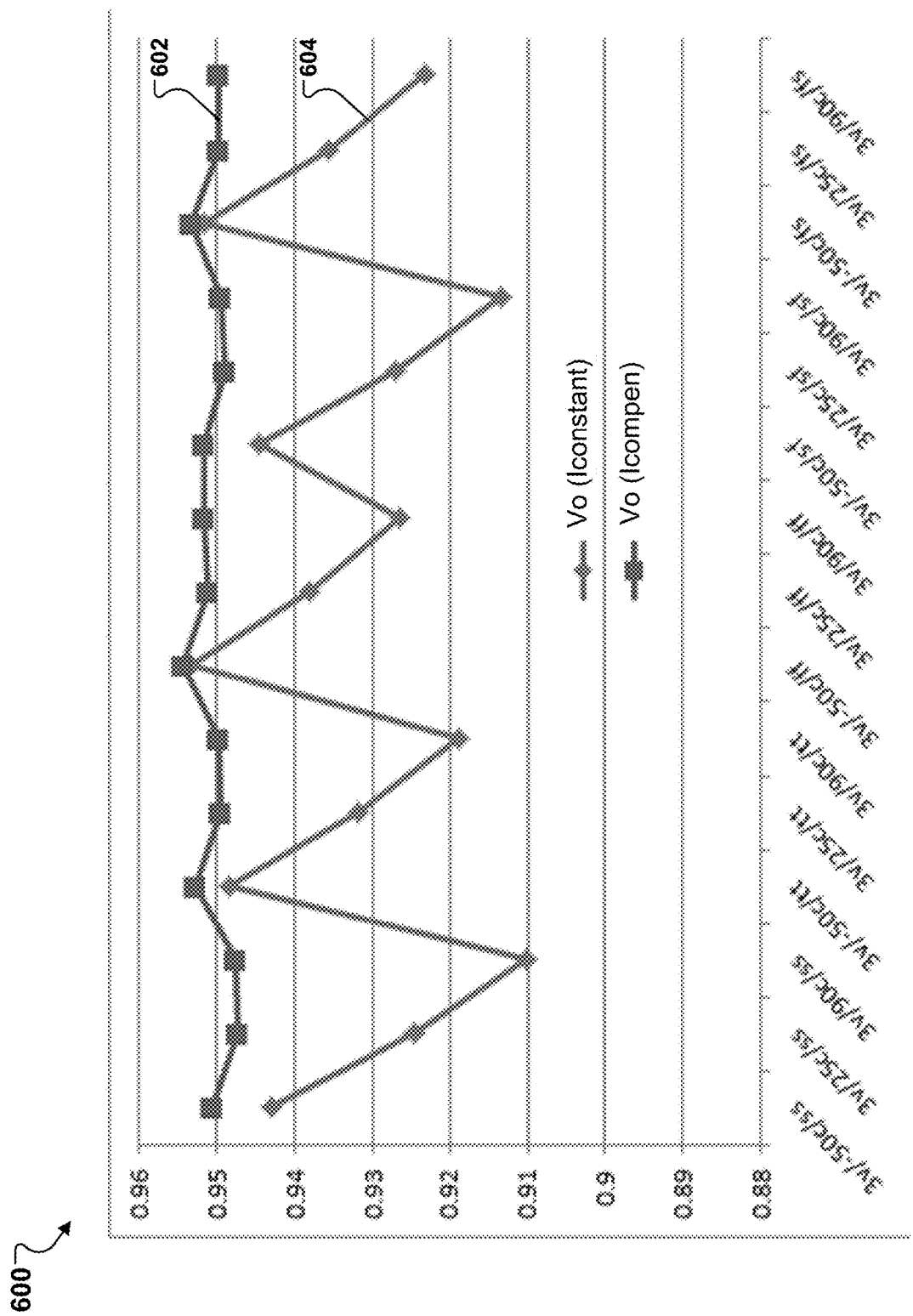
FIG. 6 shows an example of a graph of simulation results of a voltage from a VBLR generator having an unbalanced operational amplifier with input of a compensation current and with a constant current under different PVT conditions.

FIG. 6 shows an example 600 of simulation results of a terminal voltage of a VBLR generator with a compensation current and with a constant current under different PVT conditions. The VBLR generator can be the VBLR generator 170 of FIG. 1C, the VBLR generator 320 of FIG. 3A, or the VBLR generator 350 of FIG. 3B. The VBLR generator can include an unbalanced operational amplifier and an output transistor. The unbalanced operational amplifier can be the operational amplifier 322 of FIGS. 3A-3B or the operational amplifier 500 of FIGS. 5A-5C. The output transistor can be the output transistor 324 of FIGS. 3A-3B. As noted above, a clamping transistor, e.g., the clamping transistor 172 of FIG. 1C, can be coupled to the VBLR generator and a clamping voltage provided by the clamping transistor can be identical to the terminal voltage of the VBLR generator.

The different PVT conditions are illustrated in x coordinate. The first value represents voltage, which is set to be constant, 3V, in the simulation. The second value represents temperature, which is set to vary among three values (−50° C., 25° C., and 90° C.). The third value represents a process corner variation, which can be ss, tt, ff, sf, or fs. Note that ss corner stands for slow NMOS and slow PMOS case, ff corner stands for fast NMOS and fast PMOS case, sf corner stands for slow NMOS and fast PMOS case, fs corner stands for fast NMOS and slow PMOS case, and tt stands for typical NMOS and typical PMOS case that is an ideal or desired case.

The constant current is assumed to be constant under the different PVT conditions. The compensation current can be the compensation current Icompen 330 of FIGS. 3A-3B or Icompen 430 of FIG. 4 and can be inversely affected by temperature and process effects. The compensation current and the constant current are separately provided to the unbalanced operational amplifier under each PVT condition, and a terminal voltage Vo, e.g., Vo in FIGS. 3A-3B, at the source terminal of the output transistor is obtained. As shown in FIG. 6, curve 602 represents the simulation results of the terminal voltage Vo with the compensation current, and curve 604 represents the simulation results of the terminal voltage Vo with the constant current. The simulation results show that the terminal voltage Vo with the constant current varies with the variation of temperature and process, but the terminal voltage Vo is much more stable with the compensation current than with the constant current. Thus, the compensation current can effectively compensate or cancel the PVT effect on the unbalanced operational amplifier to achieve a substantially stable or constant terminal voltage Vo that can be substantially independent from the PVT effect.

Figure 7:
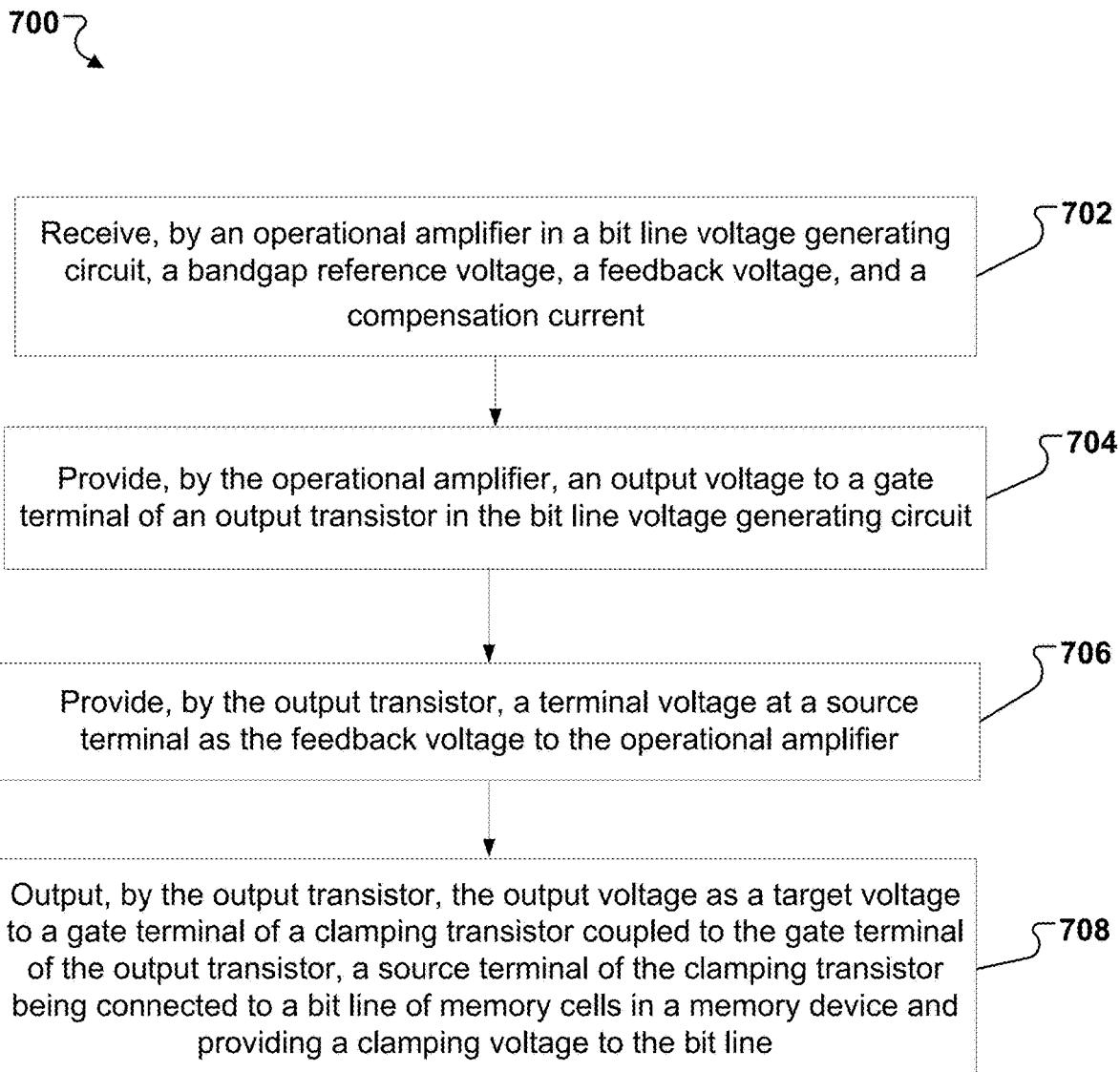
FIG. 7 illustrates a flow chart of an example of a process for managing a bit line voltage generating circuit in a memory device, according to one or more implementations.

FIG. 7 illustrates an example of a process 700 for managing a bit line voltage generating circuit in a memory device, according to one or more implementations. The memory device can be the memory 116 of FIGS. 1A-1B. The bit line voltage generating circuit can be the VBLR generator 170 of FIGS. 1B-1C, 320 of FIG. 3A, or 350 of FIG. 3B. The memory device can include a memory cell array having a number of memory cells, e.g., memory cells 152 of FIG. 1C. The memory cells are connected in series in columns with a number of bit lines and in rows with a number of word lines. The bit line voltage generating circuit can include an unbalanced operational amplifier, e.g., the operational amplifier 322 of FIGS. 3A-3B or 500 of FIGS. 5A-5C, and an output transistor, e.g., the output transistor 324 of FIGS. 3A-3B. The bit line voltage generating circuit is configured to provide a stable clamping voltage (or regulator voltage) to a bit line in the memory device.

The operational amplifier in the bit line voltage generating circuit receives a bandgap reference voltage, a feedback voltage, and a compensation current (702). The operational amplifier can receive the bandgap reference voltage from a bandgap reference system, e.g., the bandgap reference system 310 of FIG. 3A. The bandgap reference system is configured to provide the bandgap reference voltage to be constant and independent from PVT effect. The bandgap reference is directly provided to a first (positive) input of the operational amplifier, without through a bandgap buffer. The operational amplifier receives the feedback voltage at a second (negative) input. The compensation current can be provided to a third input of the operational amplifier by a compensation current circuitry, e.g., the compensation current circuitry 400 of FIG. 4, which can be included in the bandgap reference system.

The operational amplifier provides an output voltage to a gate terminal of the output transistor in the bit line voltage generating circuit (704). The output transistor can be an re-channel transistor, e.g., NMOS transistor.

The output transistor provides a terminal voltage at a source terminal as the feedback voltage to the operational amplifier (706). The output transistor receives the output voltage and generates the terminal voltage. The terminal voltage can be the output voltage minus a threshold voltage of the output transistor. The feedback voltage can be provided by the output transistor, for example, by connecting the source terminal of the output transistor to the second input of the operational amplifier.

The output transistor outputs the output voltage as a target voltage to a gate terminal of a clamping transistor coupled to the gate terminal of the output transistor (708). The target voltage is identical to a sum of the terminal voltage at the source terminal of the output transistor and the threshold voltage of the output transistor. The clamping transistor can be an n-channel transistor, e.g., NMOS transistor. The clamping transistor has a source terminal connected to the bit line of a selected memory cell in the memory device and provides a clamping voltage to the bit line. The clamping voltage is associated with the target voltage. The target voltage is identical to a sum of the clamping voltage and a threshold voltage of the clamping transistor. The output transistor and the clamping transistor can have substantially same characteristics, such that the threshold voltage of the clamping transistor can be substantially same as the threshold voltage of the output transistor and thus the clamping voltage can be substantially identical to the terminal voltage.

The compensation current is configured to compensate the operational amplifier such that the clamping voltage is substantially constant. The compensation current can cancel the PVT effect on the operational amplifier to thereby enable the clamping voltage to be substantially constant and independent from the PVT effect. In some examples, the operational amplifier is inversely affected by temperature and process effects. The compensation current can be configured to be inversely affected by the temperature and process effects, such that a voltage difference between the bandgap reference voltage and the feedback voltage is substantially independent from PVT effect.

The operational amplifier is configured to be unbalanced such that the terminal voltage is smaller than the bandgap reference voltage. The operational amplifier can include a first half bridge coupled to the first input and a second half bridge coupled to the second input, and the first half bridge and the second half bridge are configured to be different from each other. The operational amplifier is configured such that the first half bridge carries a first current and the second half bridge carries a second current that is different from the first current. The compensation current can be associated with the first current and the second current.

The first half bridge being different from the second half bridge can include at least one of: a number of transistors in the first half bridge and a number of transistors in the second half bridge being different, or transistors in the first half bridge and transistors in the second half bridge having different widths, different lengths, or different ratios between width and length. In some implementations, the first half bridge includes a first upper circuit and a first lower circuit and the second half bridge includes a second upper circuit and a second lower circuit. The first half bridge being different from the second half bridge includes at least one of: the first lower circuit being different from the second lower circuit, or the first upper circuit being different from the second upper circuit.

The memory device can further include a comparator, e.g., the comparator 176 of FIG. 1C. The comparator is configured to compare a cell voltage at a first input coupled to the cell line and the clamping transistor and a reference voltage at a second input, and output a result of the comparison indicating a value of data stored in the memory cell. The memory device can also include a column decoder, e.g., the Y decoder 148 of FIGS. 1B-1C, through which the bit line voltage generating circuit provides the clamping voltage to the memory cell line when the memory cell connected to the bit line is in a read operation.

The disclosed and other examples can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An integrated circuit comprising:
an operational amplifier comprising:
a first input for receiving a reference voltage,
a second input for receiving a feedback voltage,
a third input for receiving a compensation current, and
an output for outputting an output voltage; and
an output transistor comprising:
a first terminal coupled to the output of the operational amplifier and configured to provide the output voltage as a target voltage, and
a second terminal coupled to the second input of the operational amplifier and configured to provide a terminal voltage as the feedback voltage to the operational amplifier,
wherein the operational amplifier is configured to be unbalanced such that the terminal voltage is smaller than the reference voltage, and the compensation current is configured to compensate the operational amplifier such that the terminal voltage is substantially constant.

2. The integrated circuit of claim 1, wherein the reference voltage is constant and independent from PVT (Process-Voltage-Temperature) effect, and
wherein the compensation current is sufficient to reduce the PVT effect on the operational amplifier to thereby enable the terminal voltage to be substantially independent from the PVT effect.

3. The integrated circuit of claim 2, wherein the operational amplifier is inversely affected by temperature and process effects,
wherein the compensation current is configured to be inversely affected by the temperature and process effects, and
wherein a voltage difference between the reference voltage at the first input and the feedback voltage at the second input of the operational amplifier is substantially independent from the PVT effect.

4. The integrated circuit of claim 1, wherein the output transistor is coupled to a clamping transistor configured to receive the target voltage at a first terminal of the clamping transistor that corresponds to the first terminal of the output transistor and output a clamping voltage at a second terminal of the clamping transistor that corresponds to the second terminal of the output transistor.

5. The integrated circuit of claim 4, wherein the target voltage equals a sum of the terminal voltage and a threshold voltage of the output transistor and equals a sum of the clamping voltage and a threshold voltage of the clamping transistor, and
wherein the output transistor and the clamping transistor have substantially same characteristics, such that the threshold voltage of the clamping transistor is substantially same as the threshold voltage of the output transistor and thus the clamping voltage is substantially identical to the terminal voltage and substantially constant and independent from PVT effect.

6. The integrated circuit of claim 1, wherein the operational amplifier comprises:
a first half bridge coupled to the first input, and
a second half bridge coupled to the second input,
wherein the first half bridge and the second half bridge are configured to be different from each other.

7. The integrated circuit of claim 6, wherein the operational amplifier is configured such that the first half bridge carries a first current and the second half bridge carries a second current that is different from the first current.

8. The integrated circuit of claim 6, wherein the first half bridge and the second half bridge have different number of transistors.

9. The integrated circuit of claim 6, wherein transistors in the first half bridge and transistors in the second half bridge have at least one of different widths, different lengths, or different ratios between widths and lengths.

10. The integrated circuit of claim 1, wherein the reference voltage is provided by a reference voltage system, and the compensation current is provided by a compensation current circuitry in the reference voltage system.

11. A memory device comprising:
a memory cell array comprising a plurality of memory cells;
a plurality of memory cell lines connecting respective lines of memory cells in the memory cell array; and
a bit line voltage generating circuit configured to provide a clamping voltage to at least one of the memory cell lines, the bit line voltage generating circuit comprising:
an operational amplifier configured to receive a reference voltage, a feedback voltage, and a compensation current and output an output voltage, and
an output transistor coupled to the operational amplifier and configured to provide a terminal voltage as the feedback voltage to the operation amplifier and to provide the output voltage as a target voltage, the clamping voltage being associated with the target voltage, wherein the operational amplifier is configured to be unbalanced such that the terminal voltage is smaller than the reference voltage, and the compensation current is configured to compensate the operational amplifier such that the clamping voltage is substantially constant.

12. The memory device of claim 11, further comprising a clamping transistor coupled to the output transistor and configured to receive the target voltage and output the clamping voltage to a corresponding memory cell line of the memory cell lines,
wherein the target voltage is identical to a sum of the terminal voltage and a threshold voltage of the output transistor and identical to a sum of the clamping voltage and a threshold voltage of the clamping transistor, and
wherein the output transistor and the clamping transistor have substantially same characteristics, such that the threshold voltage of the clamping transistor is substantially same as the threshold voltage of the output transistor and thus the clamping voltage is substantially identical to the terminal voltage.

13. The memory device of claim 12, further comprising a comparator configured to:
compare a cell voltage at a first input coupled to the corresponding memory cell line and the clamping transistor and a reference voltage at a second input, and
output a result of the comparison indicating a value of data stored in a memory cell coupled to the corresponding memory cell line.

14. The memory device of claim 11, further comprising a line decoder, through which the bit line voltage generating circuit provides the clamping voltage to the at least one of the memory cell lines when at least one memory cell connected to the at least one of the memory cell lines is in a read operation.

15. The memory device of claim 11, wherein the reference voltage is constant and independent from PVT (Process-Voltage-Temperature) effect, and
wherein the compensation current is capable of cancelling the PVT effect on the operational amplifier to thereby enable the clamping voltage to be substantially constant and independent from the PVT effect.

16. The memory device of claim 15, further comprising a compensation current circuitry configured to provide the compensation current to the operational amplifier,
wherein the operational amplifier is inversely affected by temperature and process effects, and
wherein the compensation current circuitry is configured to enable the compensation current to be inversely affected by the temperature and process effects, such that a voltage difference between the reference voltage and the feedback voltage is substantially independent from PVT effect.

17. The memory device of claim 11, further comprising:
a bandgap reference system configured to provide the reference voltage and the compensation current to the operational amplifier.

18. The memory device of claim 11, wherein the operational amplifier comprises:
a first half bridge coupled to the first input, and
a second half bridge coupled to the second input,
wherein the first half bridge and the second half bridge are configured to be different from each other.

19. The memory device of claim 18, wherein the first half bridge being different from the second half bridge comprises at least one of:
a number of transistors in the first half bridge and a number of transistors in the second half bridge being different, or
transistors in the first half bridge and transistors in the second half bridge having different widths, different lengths, or different ratios between width and length.

20. A method of managing a bit line voltage generating circuit, the method comprising:
receiving, by an operational amplifier in the bit line voltage generating circuit, a bandgap reference voltage, a feedback voltage, and a compensation current, the bandgap reference voltage being constant;
providing, by the operational amplifier, an output voltage to a gate terminal of an output transistor in the bit line voltage generating circuit;
providing, by the output transistor, a terminal voltage at a source terminal of the output transistor as the feedback voltage to the operational amplifier; and
outputting, by the output transistor, the output voltage as a target voltage to a gate terminal of a clamping transistor coupled to the gate terminal of the output transistor, a source terminal of the clamping transistor being connected to a bit line of memory cells in a memory system and providing a clamping voltage to the bit line,
wherein the operational amplifier is configured to be unbalanced such that the terminal voltage is smaller than the reference voltage,
wherein the target voltage is identical to a sum of the terminal voltage and a threshold voltage of the output transistor and identical to a sum of the clamping voltage and a threshold voltage of the clamping transistor,
wherein the output transistor and the clamping transistor have substantially same characteristics, such that the threshold voltage of the clamping transistor is substantially same as the threshold voltage of the output transistor and thus the clamping voltage is substantially identical to the terminal voltage, and
wherein the compensation current is configured to compensate the operational amplifier such that the clamping voltage is substantially constant.

* * * * *